US012580725B2

(12) United States Patent
Eizips et al.

(10) Patent No.: US 12,580,725 B2
(45) Date of Patent: Mar. 17, 2026

(54) SOLAR PANEL TRANSMITTER AND SIGNAL SYNCHRONIZATION

(71) Applicant: Tigo Energy, Inc., Los Gatos, CA (US)

(72) Inventors: Daniel Eizips, Sunnyvale, CA (US);
Sergey Kondrashov, Los Gatos, CA
(US); Jeffrey Dwain Sanders, San
Jose, CA (US); Zvi Alon, Los Altos
Hills, CA (US); **Benjamin Victor
Duane Henry**, Los Gatos, CA (US);
Oleg Ivanovich Liavkin, Campbell, CA
(US); Shmuel Arditi, Discovery Bay,
CA (US)

(73) Assignee: Tigo Energy, Inc., Campbell, CA (US)

( * ) Notice: Subject to any disclaimer, the term of this
patent is extended or adjusted under 35
U.S.C. 154(b) by 528 days.

(21) Appl. No.: 17/961,980

(22) Filed: Oct. 7, 2022

(65) Prior Publication Data

US 2023/0033108 A1 Feb. 2, 2023

Related U.S. Application Data

(63) Continuation-in-part of application No. 17/225,885,
filed on Apr. 8, 2021, now Pat. No. 11,973,350.

(60) Provisional application No. 63/008,438, filed on Apr.
10, 2020.

(51) Int. Cl.
*H04L 7/033* (2006.01)
*H03L 7/08* (2006.01)
*H04B 3/54* (2006.01)

(52) U.S. Cl.
CPC ............... *H04L 7/033* (2013.01); *H03L 7/08*
(2013.01); *H04B 3/542* (2013.01)

(58) Field of Classification Search
CPC ........... H04L 7/033; H03L 7/08; H04B 3/542
See application file for complete search history.

(56) References Cited

U.S. PATENT DOCUMENTS

| | | | | |
|---|---|---|---|---|
| 5,126,690 A | * | 6/1992 | Bui ........................ H03L 7/095 |
| | | | | 331/25 |
| 5,504,454 A | * | 4/1996 | Daggett ............ H02J 13/00009 |
| | | | | 455/337 |
| 2010/0117858 A1 | * | 5/2010 | Rozenboim .............. H04B 3/56 |
| | | | | 340/870.07 |
| 2012/0314737 A1 | * | 12/2012 | Vann ................... H04L 27/3405 |
| | | | | 375/219 |
| 2019/0056482 A1 | * | 2/2019 | Nagai ................... G01S 7/4911 |
| 2019/0080346 A1 | * | 3/2019 | Sella ....................... H02S 40/34 |
| 2020/0144972 A1 | * | 5/2020 | Cheng ...................... H03F 3/24 |

(Continued)

FOREIGN PATENT DOCUMENTS

WO        2010062662        6/2008

OTHER PUBLICATIONS

Extended European Search Report, EP23202022, mailed on Feb.
26, 2024.

*Primary Examiner* — Charles Cai
(74) *Attorney, Agent, or Firm* — Greenberg Traurig

(57) ABSTRACT

A transmitter includes a modulator configured to digitally
generate a communication signal whose modulation repre-
sents coded information to be transmitted to a local man-
agement unit. The transmitter can include a control unit
configured to generate harmonic frequencies that are in-
phase, inverted, or out-of-phase from a raw signal using
fundamental frequencies for modulation.

10 Claims, 9 Drawing Sheets

(56)              References Cited

U.S. PATENT DOCUMENTS

2021/0320500 A1    10/2021  Eizips et al.
2023/0046820 A1 *   2/2023  Akinin ............... A61N 1/36046

* cited by examiner

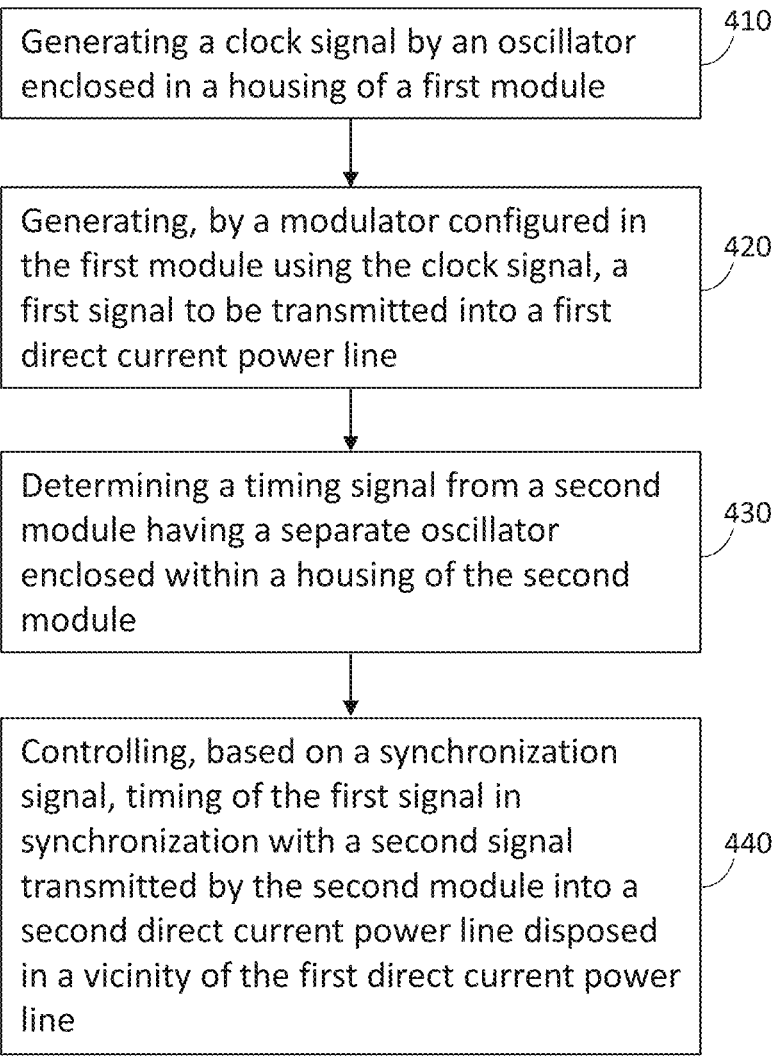

Generating a clock signal by an oscillator enclosed in a housing of a first module          410

Generating, by a modulator configured in the first module using the clock signal, a first signal to be transmitted into a first direct current power line          420

Determining a timing signal from a second module having a separate oscillator enclosed within a housing of the second module          430

Controlling, based on a synchronization signal, timing of the first signal in synchronization with a second signal transmitted by the second module into a second direct current power line disposed in a vicinity of the first direct current power line          440

FIG. 4

Divide signal without harmonic into two signal paths:

Positive voltage signal path

Negative voltage signal path

Phase accumulator

Frequency
Control
Word m n

Output Frequency
Matches master/
leader frequency

Z⁻¹

Clock

SOLAR PANEL TRANSMITTER AND SIGNAL SYNCHRONIZATION

CROSS-REFERENCE TO RELATED APPLICATIONS

This application is a continuation-in-part of U.S. application Ser. No. 17/225,885, filed on Apr. 8, 2021 and entitled "Synchronization of Signals Transmitted over Power Lines," which claims priority to U.S. Provisional Application No. 63/008,438 filed on Apr. 10, 2020 and entitled "Synchronization of Signals Transmitted over Power Lines," which is hereby incorporated herein by reference in its entirety.

FIELD OF THE TECHNOLOGY

The present disclosure generally relates to signal transmitters for a photovoltaic system, and, more particularly, to generation and synchronization of transmitter signals such as, but not limited to, signals transmitted over closely disposed power lines or wirelessly to multiple groups of photovoltaic panels.

BACKGROUND

Rapid Shutdown Systems (RSS), optimizers, and microinverters have been used in power generation systems involving photovoltaic panels (e.g., solar panels).

Rapid Shutdown System (RSS), optimizers, and microinverters can be implemented by configuring a transmitter at a location away from the photovoltaic panels to control the photovoltaic panels or the photovoltaic panels output. Rapid Shutdown System (RSS) can be stand alone or integrated in optimizers, microinverters, module level electronics or module level power electronics. Each of the above products (standalone RSS, optimizers, microinverters, module level electronics or module level power electronics) can be referred as Local Management Unit (LMU) or a Local Solar Management Unit (LSMU). Each photovoltaic panel can have a Local Management Unit (LMU) or a Local Solar Management Unit (LSMU) that controls the operation of the photovoltaic panel or its output. Based on the signals from the transmitter, or the lack of signals from the transmitter, a local management unit or a watchdog of the local management unit, can selectively turn on or off a respective photovoltaic panel or plurality of respective photovoltaic panels. A local management unit can be as simple as a signal receiver, a switch and a bypass path. These power line communications, or wireless communication signals, may be a modulation representing coded information.

For example, a string or array of the photovoltaic panels can be connected to power a direct current (DC) power line to provide the electric power generated by the string or array to an inverter that is configured at a convenient location away from the installation site of the photovoltaic panels (e.g., a rooftop). A power line communication (PLC) transmitter can transmit signals onto a power line for transmission to local management units configured on the photovoltaic panels. In another system a wireless transmitter can transmit signals wirelessly for transmission to local management units configured on the photovoltaic panels. Each local management unit can decode the power line communication or wireless signals to perform requested actions, such as turning off a photovoltaic panel, continuing power generation, etc.

For example, the PLC transmitter can transmit a keep-alive message to a Local Management Unit (LMU) to instruct the Local Management Unit (LMU) to begin and/or continue the normal operation of its photovoltaic panel in generating and/or outputting electric power for a predetermined period of time. After the predetermined amount of time, a watchdog of the Local Management Unit (LMU) is configured to automatically turn off its photovoltaic panel if another keep-alive message is not received in a predetermined period to continue the normal operation of its photovoltaic panel.

Alternatively, the transmitter can transmit an accelerated shutdown message to a Local Management Unit (LMU) to instruct the Local Management Unit (LMU) to immediately turn off its photovoltaic panel upon receiving the accelerated shutdown message, thus bypassing the time needed for the watchdog to shut down power.

Thus, when the communication path between the transmitter and the Local Management Unit (LMU) can be used to transmit the accelerated shutdown message, the photovoltaic panel(s) can be turned off rapidly via the transmission of the accelerated shutdown message. If problems occur, such a damaged communication path between the transmitter and the LMU, interference problems, weak signals, etc., the photovoltaic panel can be turned off automatically for the lack of the keep-alive message by the watchdog of the LMU within the predetermined period of time.

For example, remote shutdown can be implemented using watchdog techniques disclosed in U.S. Pat. Nos. 7,884,278, 7,807,919, 8,271,599, 9, 124, 139, 8,854,193, 9,377,765, 10,063,056, 8,933,321, 8,823,218, 9,397,612, 9,813,021, 10,256,770, and 10,312,857, the entire disclosures of which are incorporated herein by reference. Alternatively, a wireless communication may be used to transmit the keep-alive, on or off signal.

A large installation of photovoltaic panels can involve multiple sets of power lines connected to multiple strings or groups of photovoltaic panels respectively. In another configuration installation of photovoltaic panels can involve multiple sets of wireless transmitters to multiple strings or groups of photovoltaic panels respectively. The power lines of the different strings or groups may be disposed in a vicinity of each other, such as sharing the same conduit or run next to each other in parallel over a distance. Such an arrangement can result in crosstalk, where changes in the magnetic field caused by a signal transmitted on one power line induces a corresponding signal on another closely disposed power line. Alternatively, power lines farther apart can induce a signal through an electric field. Crosstalk may occur through radio transmission/reception, where the power cables form a large loop antenna, which is a portion of a wavelength of the frequencies used in some PLC signals. The induced signal may cancel, weaken, or disrupt the desired transmitted signals. The interference from the induced signal can result in errors in demodulating and decoding signals along with other unintended behaviors.

In the same manner few solar array wireless transmitters can cancel, weaken, or disrupt the desired transmitted signals.

As such, what is desired is an improved power line or wireless communication system for a solar array with reduced interference between signals conducted in disassociated power lines or wirelessly. Such improvements may be achieved by synchronizing different transmitters at either the point of transmission or the points of reception to prevent the signals canceling, weakening, or disrupting each other.

BRIEF DESCRIPTION OF THE DRAWINGS

Various embodiments of the present disclosure can be further explained with reference to the attached drawings, wherein like structures are referred to by like numerals throughout the several views. The drawings shown are not necessarily to scale, with emphasis instead generally being placed upon illustrating the principles of the present disclosure. Therefore, specific structural and functional details disclosed herein are not to be interpreted as limiting, but merely as a representative basis for teaching one skilled in the art to variously employ one or more illustrative embodiments.

FIG. 4 is a flowchart illustrating a system operation according to embodiments of the present disclosure.

DETAILED DESCRIPTION

The present disclosure relates to a power line or wireless communication. Various detailed embodiments of the present disclosure, taken in conjunction with the accompanying figures, are disclosed herein; however, it is to be understood that the disclosed embodiments are merely illustrative. In addition, each of the examples given in connection with the various embodiments of the present disclosure is intended to be illustrative, and not restrictive.

In some embodiments of this disclosure, it is desirable to use power line communication signals, or a wireless communication signal, whose modulation represents coded information. In some embodiments, the coded information can be used to increase reliability of the communication signals. Embodiments of this disclosure are directed to generating such signals with higher reliability and lower complexity.

In some embodiments of this disclosure, a harmonic filter can reduce spurious emissions for a pure signal and wired or wireless synchronization pulses and/or GNSS timing methods that can synchronize the signal to be in-phase, frequency matched, and in-time. In some embodiments, the result can be pure, synchronized signals that may, for example, be transmitted over a power line or power lines.

Figure 1:
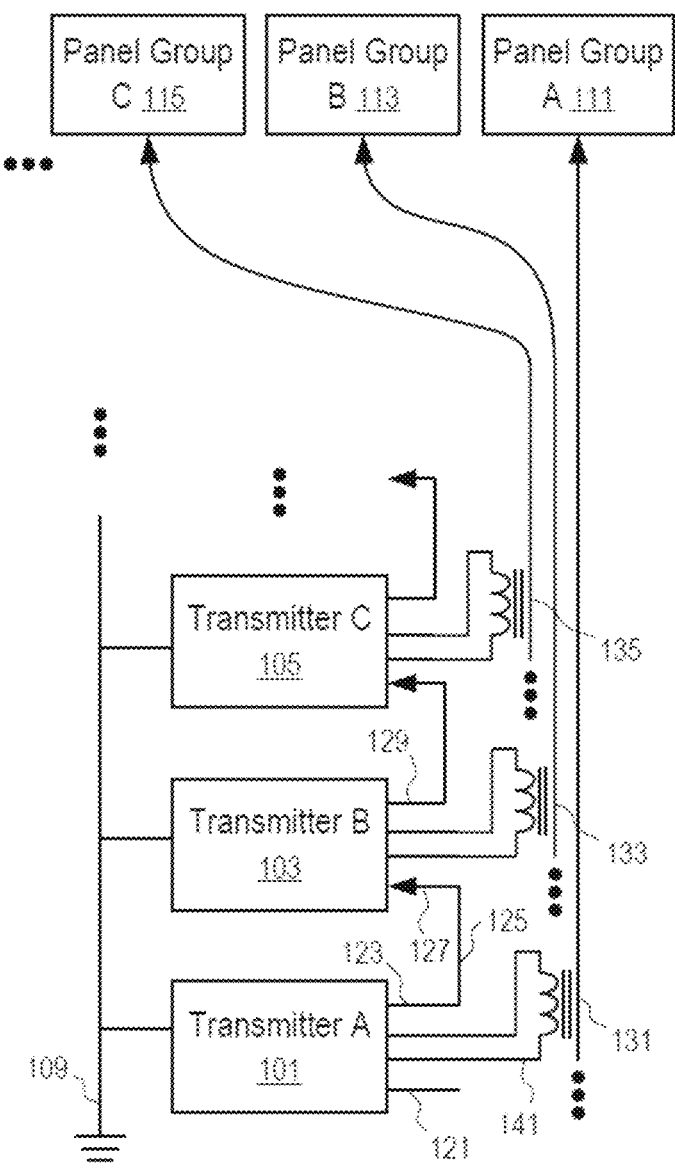
FIG. 1 shows a system configured to synchronize transmission of signals over power lines connected to photovoltaic panels according to one embodiment of the present disclosure.

FIG. 1 shows an exemplary system configured to synchronize transmission of signals over power lines connected to photovoltaic panels according to one embodiment. In general, there are different synchronization approaches to avoid interferences due to crosstalk. One approach is to transmit identical signals, in phase, at the same time. Another approach is to transmit identical signals or dissimilar signals according to a synchronized time schedule at different time instances such that crosstalk does not cause problems. For example, the transmission of signals by different transmitters can be synchronized for simultaneous actions, like synchronized swimmers performing a same action simultaneously. Alternatively, the transmission of signals by different transmitters can be synchronized for sequential actions according to coordinated timing, like synchronized swimmers jumping to the water in sequence according to a time schedule. These approaches can be implemented in the system of FIG. 1, as further discussed below.

The system of FIG. 1 has multiple groups (111, 113, 115, . . . ) of photovoltaic panels. Each of the panel groups (111, 113, 115, . . . ) can have one or more photovoltaic panels. The outputs of the photovoltaic panels in each group can be connected in parallel and/or in series to power a direct current (DC) power line. The DC powerlines (131, 133, 135, . . . ) of the panel groups (111, 113, 115, . . . ) run from the installation sites of the panel groups (111, 113, 115, . . . ) through a location or locations where transmitters (101, 103, 105, . . . ) are configured. The DC powerlines (131, 133, 135, . . . ) may run through the location to their respective loads, such as inverters, battery chargers, and/or a combiner that combines the powers from the different power lines as one output.

Each of the photovoltaic panels in the panel groups (111, 113, 115, . . . ) can have a Local Management Unit (LMU). Some LMUs may manage more than one panel. In response to an accelerated shutdown message received via a power line, the Local Management Unit (LMU) can disconnect a photovoltaic panel from its associated power line. Depending on the message received, an LMU may also attempt to discharge its associated inverter's capacitor in concert with other LMUs to drop the power line voltage to a safe level for humans. In response to a keep-alive message, a watchdog circuit of the Local Management Unit (LMU) can avoid disconnecting the respective photovoltaic panel for a predetermined period of time in absence of the shutdown message.

Each of the transmitters (101, 103, 105, . . . ) could be exemplarily coupled to a common ground (109) and configured to generate and transmit a keep-alive message for the watchdog circuits of the Local Management Units (LMUs). The keep-alive message is transmitted onto a power line (e.g., 131, 133, or 135). For example, an inductive coupling between the transmitter (e.g., 101, 103, or 105) and a power line (e.g., 131, 133, or 135) can be used to induce signals on the power line (e.g., 131, 133, or 135) to transmit the keep-alive message. Alternatively, the transmitters can be configured to transmit the keep-alive message into the power line (e.g., 131, 133, or 135) via direct connections or via wireless connections.

The signals of a message transmitted by a transmitter (e.g., 131, 133, or 135) can be generated via various modulation methods such as, but not limited to, S-FSK, AM, FM, PCM, PPM, PM, QAM, SM, SSB, ASK, APSK, CPM, FSK, MFSK, MSK, OOK, PSK, SC-FDE, TCM, WDM, WDM, CSS, DSS, FHSS, THSS, CDMA, TDMA, FDMA, OFDM, suitable combinations thereof, or the like. For example, a continuous wave signal of an intermediate frequency (IF) can synthesize a first frequency (Mark Frequency) and a second frequency (Space Frequency), which are modulated by a state machine through a multiplexer to implement S-FSK and form a message (e.g., containing 33-bit data in the form of three, eleven-bit words) that is transmitted over a first time period (e.g., 168 ms) (transmission period) followed by a second time period of transmission silence (e.g., 901 ms) (silence period).

The transmitters (101, 103, 105, . . . ) can be configured to transmit different messages having different data encoded using S-FSK or any other modulation technique. The messages can include keep-alive, accelerated shutdown, permission to operate including, but not limited to, permission to operate, permission to operate with no inverter discharge on signal loss, having no permission to operate, and/or proprietary messages in proprietary formats and/or proprietary modulation methods, etc. The messages could also be addresses used to switch power on or off in select portions of a photovoltaic array. In some implementations, the lack of a keep-alive message for a period of a predetermined length (e.g., 13 seconds) can be considered a shutdown message.

In FIG. 1, each of the transmitters (101, 103, 105, . . . ) has an input line for synchronization (e.g., sync-in) and an output line for synchronization (e.g., sync-out). The sync-out (e.g., 123) of a transmitter (e.g., 101) can be connected (125) to the sync-in (e.g., 127) of another transmitter (e.g., 103) so that the transmission periods of the transmitters (101, 103, 105, . . . ) are coordinated to avoid interference that may occur due to potential crosstalk among the DC power lines (131, 133, 135, . . . ). For the example, the transmitters (101, 103, 105, . . . ) can be coordinated in phase if they transmit at the same time, or coordinated by taking turns to transmit different messages to different rapid shutdown receivers in an array of solar panels. In some embodiments, the transmitters (101, 103, 105, . . . ) can be coordinated in phase if they transmit the same message. Transmitters can be connected in the daisy chain fashion as illustrated in FIG. 1. In some embodiments, transmitters can also be connected in a star or parallel fashion where all transmitters to be synchronized are connected to a single master transmitter.

One of the transmitters (e.g., 101) can function as a master transmitter that does not receive an input in its sync-in terminal (121). In some embodiments, the master transmitter can alternatively be referred to as a leader transmitter or the like. Its sync-out terminal (123) is connected (125) to the sync-in terminal (127) of the next transmitter (e.g., 103); the sync-out terminal (129) of the next transmitter (e.g., 103) can be connected to the sync-in terminal of a further transmitter. For example, slave transmitters can be daisy chained and/or connected in parallel. In some embodiments, the slave transmitters can be referred to as follower transmitters or the like. In some embodiments, synchronization can be achieved without using a synchronization line. In such embodiments, a transmitter planned to transmit may check whether other active transmitters exist in the vicinity. In some embodiments, each transmitter checks for existing transmissions before starting to transmit. In response to a transmission being detected, a synchronization procedure may be implemented. A transmitter may detect another transmitter with a rectifier circuit used to produce an envelope that can be used as a synchronization pulse to sync phase and frequency. Such techniques can be implemented in wireless or power line communication.

In some embodiments, any or all transmitters may also be synchronized to an external synchronization signal that uses a Global Positioning System (GPS) or Global Navigation Satellite System (GNSS) as a timing and frequency reference. In such embodiments, the GPS/GNSS based module may act in the place of a master/leader transmitter, or the GPS/GNSS based signal generated may be incorporated as part of a transmitter which may act as a standalone, self-synchronized transmitter or as a leader transmitter that coordinates its follower transmitters.

Figure 2:
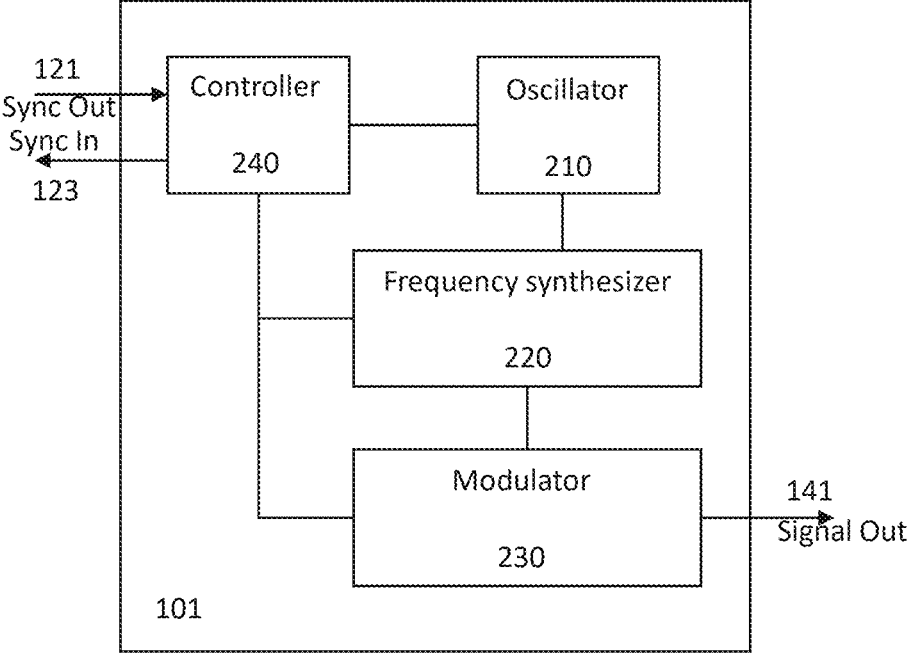
FIG. 2 is a block diagram of a transmitter according to an embodiment of the present disclosure.

FIG. 2 is a block diagram of an exemplary transmitter (101) according to an embodiment of the present disclosure. For example, the transmitter (101) of FIG. 2 can be used to implement each of the transmitters (101, 103, 105) in the system of FIG. 2 and to generate communication signal(s) whose modulation represents coded information. The transmitter (101) of FIG. 2 includes an oscillator (210) for generating a clock signal which is supplied to a frequency synthesizer (220) that synthesizes one or more frequencies. The clock signal is used to synthesize frequencies and to modulate a first signal (141) transmitted to the first DC power line (131). The transmitter (101) also includes a controller (240) that controls the start time (phase) and desired synthesized frequencies of the first signal (141). The controller (240) has an input terminal (121) and an output terminal (123). The input terminal (121) receives a timing and/or frequency reference for controlling the first signal (141). The output terminal (123) exemplarily passes through the timing and/or frequency reference to the next transmitter (103) as shown in FIG. 1. The transmitter may also generate its own timing signal without relaying the signal it receives. A master transmitter may also transmit an original timing signal and/or frequency reference that is received by all slaves connected in parallel to it in order to reduce propagation delays.

The transmitter (101) can have out-of-band spurious emissions by nature because the Laplace/Fourier transform of a square wave has harmonics given by the following, for a square wave of frequency f, the components that make it are:

$$\sin(2\pi ft) + \frac{1}{3}\sin(3*2\pi ft)$$

$$+ \frac{1}{5}\sin(5*2\pi ft) + \frac{1}{7}\sin(6*2\pi ft) + \ldots + \frac{1}{n}\sin(n*2\pi ft)$$

Mathematically pure square waves have odd-harmonics. In some embodiments, even a slight duty cycle error caused by different rise/fall timing of N/P-Channel FETs or NPN/PNP bipolar transistors, among other things, can create even-harmonics in a "square wave" too. These out-of-band, spurious emissions are undesirable when used in a communication protocol, causing problems with energy consumption, heat generation, a receiver demodulating a signal on undesired channels, power-line arc detection issues, interference with wireless communications, or any combinations thereof or the like. Filtering out these spurious emissions can be expensive and/or waste power in a transmitter by using filters with transistors in linear mode (consuming large amounts of power), using large, expensive, high power components for filters with transistors in saturation, or modulating by filtering a high-frequency envelope, or the like.

The transmitter (101) can use a digitally generated signal to reduce undesired harmonics, spurious emissions, and reduce necessary filtering. In some embodiments, an example for the digitally generated signal is a time-domain filter such as a harmonic filter. A digitally generated signal from inside the transmitter (101) can replicate the even harmonics, odd harmonics, or combinations thereof, of the imperfect modulated-output and subtract the harmonic replica from the imperfect, composite signal in the time domain to filter the signal. Harmonic free signals can also be produced from stored, pre-determined digital sequences that are the result of subtracting harmonics. In some embodiments, the harmonic frequency signal or the digitally generated signal can reduce or eliminate other forms of filtering.

In some embodiments, the amplitude of the harmonic frequency signal can be precisely controlled to maximize the filter's effectiveness. In some embodiments, the harmonic frequency signal can be adjusted with a voltage divider. In some embodiments, the amplitude of the harmonic frequency signal can be adjusted by varying the duty cycle of the generated harmonic frequency signal. A sinc function is defined as:

$$\frac{\sin(\pi x)}{\pi x}$$

The sinc function can be used to help calculate the duty cycle needed for the associated amplitude of the generated harmonic because the sinc function is a sine wave that decays in amplitude as 1/TTX.

Figure 3A:
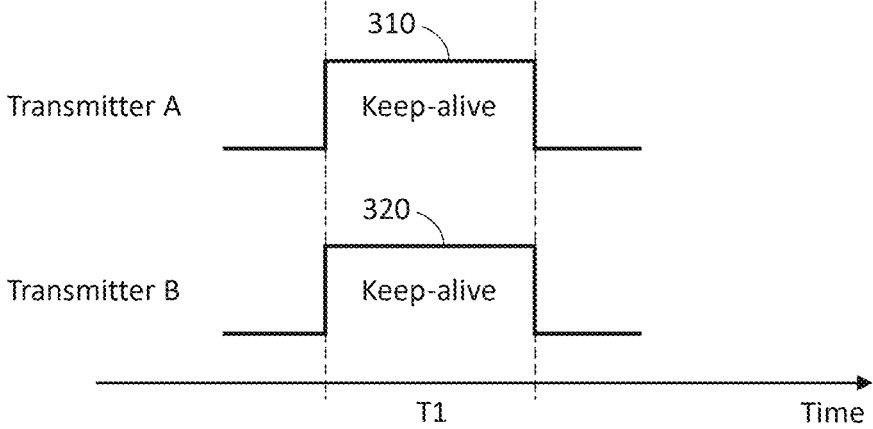
FIGS. 3A and 3B show timing diagrams of two of the transmitters according to embodiments of the present disclosure.
Figure 3B:
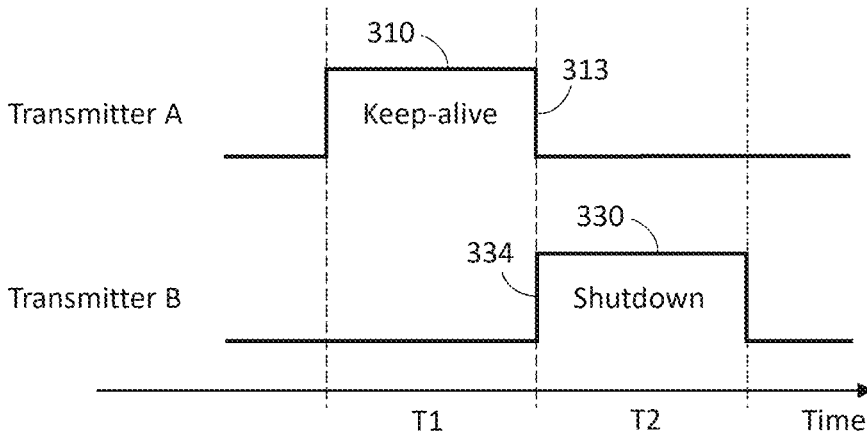

FIGS. 3A and 3B show timing diagrams of two of the transmitters (101 and 103 of FIG. 1) according to an embodiment of the present disclosure. Referring to FIG. 3A, when transmitter A (101) and transmitter B (103) are to transmit the same message (e.g., Keep-alive), the sync-out and sync-in signals passed from transmitter A (101) to the transmitter B (103) over the connection (125 of FIG. 1) can cause their transmission of the message in substantially overlapped time windows (310 and 320) for a duration of T1. After a predetermined period of time, the Keep-alive message can be repeated in substantially overlapped time windows to prevent the Local Management Units in the panel groups (111 and 113), connected to the respective power lines (131 and 133) from shutting off the panel groups (111 and 113).

For example, when the master transmitter (101) starts a transmission period (310) containing signals (141) for its keep-alive message on the DC power line (131), it also provides a timing signal from its sync-out terminal (123) to the sync-in terminal (127) of the next transmitter (103), causing the next transmitter (103) to start its transmission period (320) containing signals for its keep-alive message on the DC power line (133) such that the timing and phase of the keep-alive messages are substantially in synchronization with each other. Therefore, potential crosstalk among the DC power lines (131 and 133) does not degrade the signals and/or interfere with each other.

Similarly, the next transmitter (103) can provide or pass through its received sync-out signal to control the timing or phase of a further transmitter (105) for synchronization. Although cascading in-step signals inevitably causes propagation delay, the aforementioned transmissions are substantially or sufficiently coordinated, e.g., in substantially the same time, so that the messages are not corrupted even when there is crosstalk between the power lines (131, 133, 135) and thus the transmitted signals/message can be correctly received by the Local Management Units in the photovoltaic panel groups (111, 113 and 115).

Referring to FIG. 3B, when the transmitters (101, 103, 105, . . . ) are used to transmit messages in sequence, the timing signals provided through the sync-out to sync-in connection (e.g., 125) can be used to schedule different messages in different time windows relative to preceding timing signals. For example, the synchronization signal transmitted from the connection (e.g., 125) can have a rising edge representing the start of the time window (310) of its Keep-alive message (or another message) and a falling edge (313) representing the end of the time window (310); and a slave transmitter (103) can be configured to start the time window (330) of transmission a different message (e.g., addressable power on/off messages) in response to the falling edge (313) of the synchronization signal it receives at its sync-in terminal (127) from its master transmitter (101) that provides the synchronization signal on its sync-out terminal (123) over the connection (125). Based on its transmission time window (330), the transmitter (103) generates its synchronization signal on its sync-out terminal (129), with a rising edge (334) to indicate the start of its transmission time window (330) and a falling edge to indicate the end of the time window (330).

As shown in FIG. 3B, a transmission time duration T2 for transmitter B (103) has no overlap with the transmission time duration T1 for transmitter A (101). Thus, transmission by transmitter B (103) does not corrupt the message of transmitter A (101), even when there is crosstalk between the power lines 131 and 133. In one implementation, the falling edge (313) of the sync pulse of the time window (310) of transmitter A (101) triggers a rising edge (334) of the sync pulse (330) of transmitter B (103). This arrangement causes the transmitters to automatically cascade their transmissions like dominos or synchronized swimmers jumping into a pool in sequence.

For example, the timing signals in the sync-out to sync-in connections (e.g., 125) can be used to indicate the timing for the transmission of various PLC messages. In some embodiments, when a transmitter (e.g., 103) is about to transmit its message, the transmission period can start with a predetermined offset (e.g., a time slot) from the transmission period of the keep-alive message to avoid potential interference due to crosstalk.

The sync-out to sync-in connections of the transmitters (101, 103, 105, . . . ) can be configured in a daisy chain configuration or a star configuration to reduce wire delay and transmitter propagation delays.

The timing signal in a connection (e.g., 125) from a sync-out terminal (123) of a master transmitter (e.g., 101) to a sync-in terminal (127) of a slave transmitter (e.g., 103) can be the envelope profile signal of transmissions generated by the master transmitter (e.g., 101), or a signal with a predetermined time and/or phase relation to the envelope profile signal (e.g., rising edge, falling edge, levels, etc.) of transmissions generated by the master transmitter (e.g., 101), or a synchronization signal with a dynamically or predetermined time relation with a rising or falling edge of the synchronization signal. The width of the known length envelope profile can also provide a frequency reference of the master/leader's oscillator, allowing a slave/follower to estimate and compensate for the difference between itself and its frequency reference.

Optionally, for more precise synchronization, an additional reference frequency can be included for phase locking oscillators between transmitters, where the master and slave transmitters are configured to phase lock with the reference frequency.

Optionally, the timing signal includes a copy of the signals transmitted by the master transmitter (e.g., 101) over its power line (e.g., 131); and the slave transmitter (e.g., 103) can re-transmit the signals on its power line (e.g., 133) to provide the same message the slave transmitter (e.g., 131) received. The slave can also simply re-transmit the master's signal without any timing adjustment (e.g., the slave functions like an analog amplifier for the master's transmission to Local management Units (LUMs) and/or relaying any synchronization signals to other slaves).

Optionally, the timing signal includes a copy of the transmitter's unmodulated or demodulated data message (e.g., 101); and the slave transmitter (e.g., 103) can optionally delay or replace the unmodulated message for modulation and transmission at a predetermined time window by providing its own different modulated message, or the master's modulated message.

Optionally, the slave transmitter (e.g., 103) can generate separate sync-out signals in response to its received sync-in signals. Alternatively, the slave transmitter (e.g., 103) amplifies its received sync-in signals and provides the amplified sync-in signals at its sync-out terminal. Re-transmission of the received sync-in signals can be performed to reduce the propagation delay associated with generating a separate sync signal. Alternatively, digital signals can be used for synchronization, which can be regenerated, then transmitted without amplification.

The slave transmitter (e.g., 103) can be configured to adjust its timing for every transmission period, or a predetermined number of transmission periods. A master transmitter can become a slave transmitter after it senses a periodic sync signal and dynamically determines that it should be a slave transmitter. Alternatively, a slave transmitter can be hard configured to be a slave transmitter or become a master transmitter in the absence of incoming synchronization signals.

FIG. 1 illustrates the synchronization/coordination of transmission time periods using sync-out to sync-in connections (e.g., 125). Alternatively, synchronization/coordination can be implemented without any timing signals being transmitted via sync-out and sync-in terminals.

For example, a transmitter (e.g., 101) can dynamically detect a modulated PLC message transmitted on the power line (131). During a silence period of the transmitter (e.g., 101), the transmitter itself (e.g., 101) can listen to the power line for signals that are not transmitted by the transmitter itself (e.g., 101). If a signal is detected, the transmitter (e.g., 101) can use the detected signal as a timing and/or frequency reference signal to re-calibrate its timing schedule for transmitting message. If no signal is detected, the transmitter (e.g., 101) sends its message without adjusting its transmission timing.

For example, during an initial period, the transmitters (101, 103, 105, . . . ) can listen to their respective power lines (131, 133, 135, . . . ) for silence and decide to start transmission of their messages. In some embodiments, each transmitter message has the same transmission time and silence time, i.e., the same frequency and duty cycle, the same period, etc. In such embodiments, synchronization can be accomplished by adjusting the phase of a transmission relative to other transmissions. To do this, the transmitters (101, 103, 105, . . . ) further listen to their respective power lines (131, 133, 135, . . . ) for crosstalk from out of sync transmissions of other messages. If messages from other transmitters are detected, the transmitters (101, 103, 105, . . . ) adjust their respective transmission phase timing for synchronization with other transmitters to avoid collisions. Synchronization can be achieved by iterating through different phases between transmitters until there are no more collisions between transmissions; and the transmission of other messages can be scheduled relative to the timing of other messages. When such a synchronization technique is used, the sync-in and sync-out terminals can be eliminated.

Transmission collision can occasionally happen when two or more transmitters detect silence and decide to transmit at the same time. This is tolerable provided that collisions don't happen frequent enough to trigger the watchdog in a Local Management Unit (LMU) from shutting down a photovoltaic panel.

The transmission timing of a transmitter can be adjusted via resetting the frequency synthesizer of the transmitter. In some embodiments, the frequency of the oscillator or phase locked intermediate frequency in a transmitter for synthesis of the modulation frequency or frequencies should be high enough or be phase locked to each other for the modulation frequency or frequencies to achieve desired, minimal phase differences for simultaneous transmissions. A timing signal received in the sync-in terminal (or determined in response to detecting a message) can be used to reset the frequency synthesizer (or set its phase to 0 degrees) along with the modulator that controls the transmission state at a predetermined time of the transmission cycle. Such a reset operation can be adequate to synchronize the transmitters within a few nano seconds or a degree of phase.

Optionally, a slave transmitter can be configured to indicate that it is in a slave mode via LED or another user interface element.

Optionally, a slave transmitter can be configured to count the timing signals received via its sync-in terminal. If a slave ceases to count the arrival of the timing signals from its sync-in terminal at a predetermined and proper frequency, either by design or through failure, the slave can assume the role of a master transmitter to generate its sync-out signals to control other slave transmitters.

Optionally, a master transmitter can be configured to indicate that it is in a master mode via LED or some other means.

FIG. 4 is a flowchart illustrating a system of operation according to embodiment of the present disclosure. For example, the method illustrated in FIG. 4 can be implemented in the system of FIG. 1, with each transmitter implemented in a way as illustrated in FIG. 2 to synchronize time windows of their message transmissions in timing illustrated in FIGS. 3A and/or 3B. Each transmitter (e.g., 101) can be configured as a module usable to remote control the operations of a solar panel group (e.g., 111) by generating and sending messages (e.g., Keep-alive, Shutdown) to individual strings or the entire solar array. To coordinate the timing of their transmissions, the sync-in and sync-out terminals of the modules/transmitters can be connected (e.g., as illustrated in FIG. 1, in a chain configuration, or a star configuration)

In block 410, a first module (e.g., transmitter 103) generates a clock signal by an oscillator enclosed in a housing of the first module. In block 420, a first signal is generated, by a modulator (230) using the clock signal, to be transmitted into a first DC power line (e.g., 133). In block 430, the first module (e.g., transmitter 103) determines a timing signal (e.g., an envelope signal of a second signal for sending a message in a time window (310)) from a second module (e.g., transmitter 101) having a separate oscillator (210) enclosed within a housing of the second module. In block 440, the first module (e.g., transmitter 103) controls, based on the timing signal, timing of the first signal (e.g., transmitted in a timing window (320 or 330)) in synchronization with a second signal transmitted by the second module (e.g., in the timing window (310)) into a second DC power line (e.g., 131). Thus, even when the second DC power line (e.g., 131) is disposed in a vicinity of the first DC power line (e.g., 133), crosstalk between the lines (131 and 133) do not corrupt the first and second signals. If a first module is unable to determine a timing signal from a second module, the first module can generate its own timing signal that can be used in determination by mother modules.

In one example, each slave transmitter can be given a time slot to transmit a message, either repeated or unique. The timeslots can be based relatively against the transmission of a timing signal or beacon of the master transmitter. The time slots can be assigned by the master, or they can be self-assigned by switches, dials, remote or wireless based GUIs, etc., on the slaves or "initial" timing of falling edges of slaves.

Synchronization has limitations. Without knowledge of wire length or distance between transmitters, location of transmitters and arrays, wire length between transmitters and arrays, temperature changes, oscillator drift characteristics, etc., these solutions are limited to synchronizing within a limited proximity due to propagation delay of the PLC signal wavelengths. This can limit the number of transmitters that can be synchronized on a large solar panel installation.

In some embodiments, GNSS (Global Navigation Satellite System) can be used. In some embodiments, GNSS includes, but is not limited to, any combination of GPS, BeiDou, Galileo, GLONASS, IRNSS, NavIC, QZSS, etc., along with any future GNSS implementations of GNSS constellations.

A GNSS solution for PLC signal synchronization can eliminate the need for interconnect wires to synchronize between PLC transmitters. In some embodiments, an unlimited number of transmitters can be synchronized, regardless of the size of the photovoltaic installation. In some embodiments, use of GNSS can eliminate successive propagation delays from distance and signal regeneration between devices.

In some embodiments, GNSS receivers can calculate a position in ECEF (Earth Center, Earth Fixed) coordinates (XYZ), GPS time, universal coordinated time (UTC), clock bias, local oscillator frequency drift, etc. Some GNSS receivers also produce a one pulse per second (pps) signal. For instance, a GPS based 1 pps signal is synchronized to the USNO (U.S. Naval Observatory) master clock regardless of the location on earth or receiver antenna cable length. In this example, UTC (USNO) can be calculated by adding the appropriate leap seconds to GPS time. All GNSS based time systems are acceptable for PLC based synchronization of time, phase, and frequency.

In some embodiments, the pps signal can be used in a variety of ways to eliminate crosstalk issues in photovoltaic arrays using a PLC to communicate with individual modules.

Some GNSS receivers allow the user to change the pps signal frequency. To be SunSpec/IEC compliant, it could be useful to change the GNSS pps frequency to be slightly less than 1 pps. For example, the period can be from 1.0699 s to 1.0702 s to meet a PLC message specification in compliance with the SunSpec or IEC specifications for Rapid Shutdown Systems. In some embodiments, the SunSpec/IEC period can be 1.07008 s. Synchronizing PLC transmitters can also be accomplished with a customized GNSS pps output with a period of 1.07008 s and duty cycle of (168.96 ms/1.07008 ms) percent.

Alternatively, a GNSS based 1 pps signal or any desired pps frequency and duty cycle could itself be used to synchronize PLC transmitters. The edges of the GNSS pps output can synchronize phase and time, and the duty cycle can act as a frequency reference for any transmitter to remove its frequency bias due to burn-in, retrace, aging, temperature, etc. In some embodiments, the transmitter could have a disciplined oscillator with the accuracy of an atomic clock, regardless of its environment.

To generate a 1.07008 s period used by SunSpec from a pps output, GPS, along with other GNSS receivers, measure time by seconds in a week and number of weeks within an EPOCH (rollover) of 1024 weeks (in the case of GPS).

The lowest common denominator between a period of 1 s and a period of 1.07008 s (used in SunSpec and IEC) is 3,125 s, or 52 minutes and 5 s.

To synchronize transmitters using a 1 pps GNSS system, PLC systems compliant with SunSpec and IEC specifications could use UTC Time or GPS time (week number*seconds per week+current second in week) and take the modulus (remainder) of 3125. The remainder can then be multiplied by a resolution a-time, such as 320 µs, to provide a conversion offset between the 1 pps and 1.07008 s IEC periods. The 1 pps signal plus this calculated offset is when a synchronization instrument such as a CPU or a digital state machine sends a PLC message. This method could be used with GPS time, UTC (NIST), UTC (USNO), Zulu, GMT, TAI, or any other available system that can be used to produce a periodic signal with the same desired phase and frequency and/or duty cycle. This is one of many methods that can be used to convert a GNSS 1 pps signal to a custom period and duty cycle and should not be considered limiting the scope of this disclosure In some embodiments, any number of transmitters can send their PLC messages to PLC receivers at a specific time, phase, and frequency. In some embodiments, advantageously, no communication is needed between any PLC transmitters because their coordination is calculated based on GNSS time.

In some embodiments, if different messages are to be sent from different PLC transmitters, time slots can be defined for different PLC transmitters. The transmitter can be assigned a time slot with or without communication other PLC transmitters. For instance, transmitters could communicate to decide which time slots are used, which are available, and which slot gets assigned. A photovoltaic system operator could manually assign a transmitter a certain address manually via a dip switch, or by using a handheld device such as a commissioning application on a smart phone. It could also be assigned remotely via a web interface through a photovoltaic monitoring system.

In some embodiments, instead of autonomous, calculated synchronization, PLC transmitters could use the same time system, but with wired or wireless coordination between PLC transmitters. For instance, to avoid latency issues they can communicate that the next transmission or the first time slot will begin at a relative future time. In some embodiments, one transmitter may announce the next transmission slot based on GNSS time. In some embodiments, the transmitters could also coordinate time slots for transmission of different messages. For instance, one transmitter could announce the next time for all generic, identical shutdown messages to be sent, or the time for addressing array of PV modules #1 is to turn on. Generic, identical messages can be sent at the same time because cross-talk is not destructive. In some embodiments, this method could adjust the size of the time slots based on the number different messages that need to be sent, PLC transmitter count, addressing modes, etc. In some embodiments, transmitters could also announce the number of time slots, time slot duration(s), etc., and the first transmission times based on both absolute time and time relative to the time of transmission.

Even in precisely synchronized systems, such as mentioned above, Time Difference Of Arrival (TDOA) at signal reception points can still produce cross-talk. For instance, two PLC transmitters out of proximity of each other send a signal to their respective in-proximity arrays with differing cable lengths. There can be destructive cross-talk in respective photovoltaic arrays even if the PLC signals were sent at the same time by two transmitters. Some topologies of transmitter locations and proximity may not produce cross-talk if the transmitters are close to each other, but other topologies may still produce crosstalk if the distance between transmitters are more than a fraction of a wavelength of a PLC frequency apart.

In some embodiments, GNSS receivers can measure distance between receivers because they know their own coordinates in ECEF, Latitude, Longitude, Altitude (LLA), etc. A great circle distance is easily computed which can potentially be used to estimate distances between PLC transmitters or between PLC transmitters and their respective arrays if a mobile GNSS receiver is used during installation and commissioning.

In some embodiments, GNSS can also measure power cable length. The time taken to travel through the wire can be measured by marking the GNSS time it was a received and subtracting the GPS time it was sent. The power cable distance can then be computed based on the travel time. This can be used to measure wire length between PLC transmitters. It can also be used to measure wire between the transmitter and the array when using a mobile GNSS receiver during installation and commissioning.

Knowledge of wire length may be useful to mitigate cross-talk produced by the time difference of arrival.

Irrespective of how cross-talk is produced, TDOA, or some other means, it can be adjusted and tuned by a PLC transmitter by adding a positive or negative phase delay to its assigned transmission. For instance, if TDOA was measured to be about 30° phase at the Mark frequency used in the SunSpec S-FSK signal, this could be adjusted by advancing the transmission of the respective receiver.

In some embodiments, TDOA adjustments are possible with unassisted PLC transmitters. In some embodiments, TDOA adjustments may work better with GNSS based PLC transmitters because GNSS eliminates frequency drift due to burn in, retrace, aging, temperature changes, along with beat frequencies between PLC transmitters.

In some embodiments, taking phase adjustments for TDOA or other means of crosstalk could be made by a dial on the PLC transmitter, up-down buttons, etc. In some embodiments, phase adjustments could be made automatically by algorithms using wire measurements, etc. In some embodiments, phase measurements could be made wirelessly via a commission application on a smart phone or other computing device, etc. In some embodiments, the phase measurements can be made remotely by a web monitoring system. TDOA can also be adjusted automatically by finding the 180° out of phase point where signals cancel each other completely, and then adjusting the phase by −180° to line signals up properly.

In some embodiments, an upgrade module that mimics the existing synchronization behavior of a master/leader synchronization transmitter could be used to eliminate synchronization cables and improve the accuracy of existing synchronized transmitters. For instance, a large solar production installation may have a few synchronized transmitters connected by wires but is too large to synchronize the signals throughout the photovoltaic array. GNSS adapter modules could be used to replace synchronization cables, and unsynchronized PLC transmitters could be retrofitted to become synchronized.

In some embodiments, a hybrid solution can include a GNSS module that can be used to synchronize a group of transmitters within a certain proximity.

In some embodiments, an existing installation could be retrofitted by adding a single GNSS module to the master/leader transmitter in a transmitting array, without changing its existing slave/followers that are already connected by wires. Unsynchronized transmitters could become synchronized by adding a GNSS retrofit/upgrade.

In some embodiments, the synchronization pulse width can be used to estimate frequency drift between the master transmitter and the slave transmitter. In some embodiments, this is possible because the message being provided from the master transmitter to the slave transmitter is a fixed message. If the messages are of variable length, a fixed length pulse can act as a frequency reference irrespective of variable message length. In some embodiments, the estimated frequency can be used to compensate for frequency drift over time.

The techniques discussed above can provide scalability and increase the reliability of signals transmitted via power lines by a Rapid Shutdown System (RSS) for an array of photovoltaic panels.

In some embodiments, PLC signal synchronization, either in-step, or in sequence, can improve the quality of communication between transmitters and their respective receivers. Removing unwanted tones from the signal, such as harmonic frequencies of the transmission that cause spurious emissions can reduce the transmitter's power consumption and prevent interference with other types of communication devices.

Figure 5:
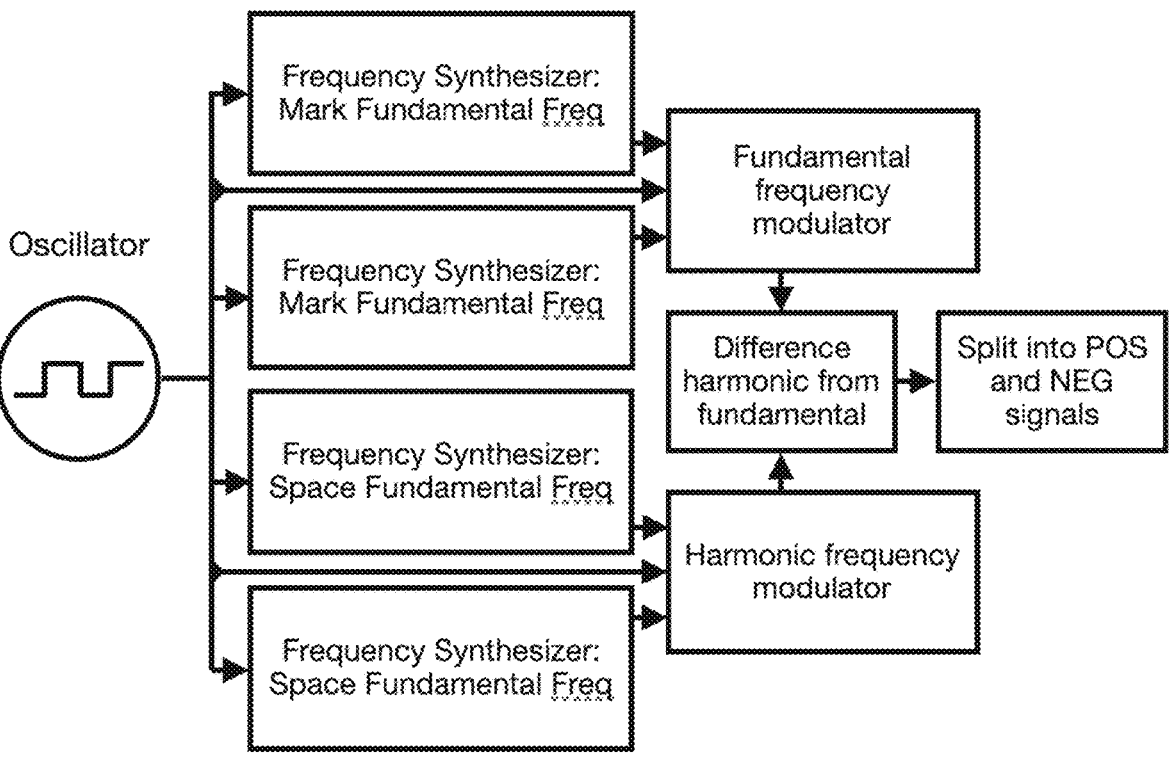
FIG. 5 is a block diagram of a transmitter operation for removing harmonic frequencies, according to embodiments of the present disclosure.
Figures 6A, 6B, 6C:
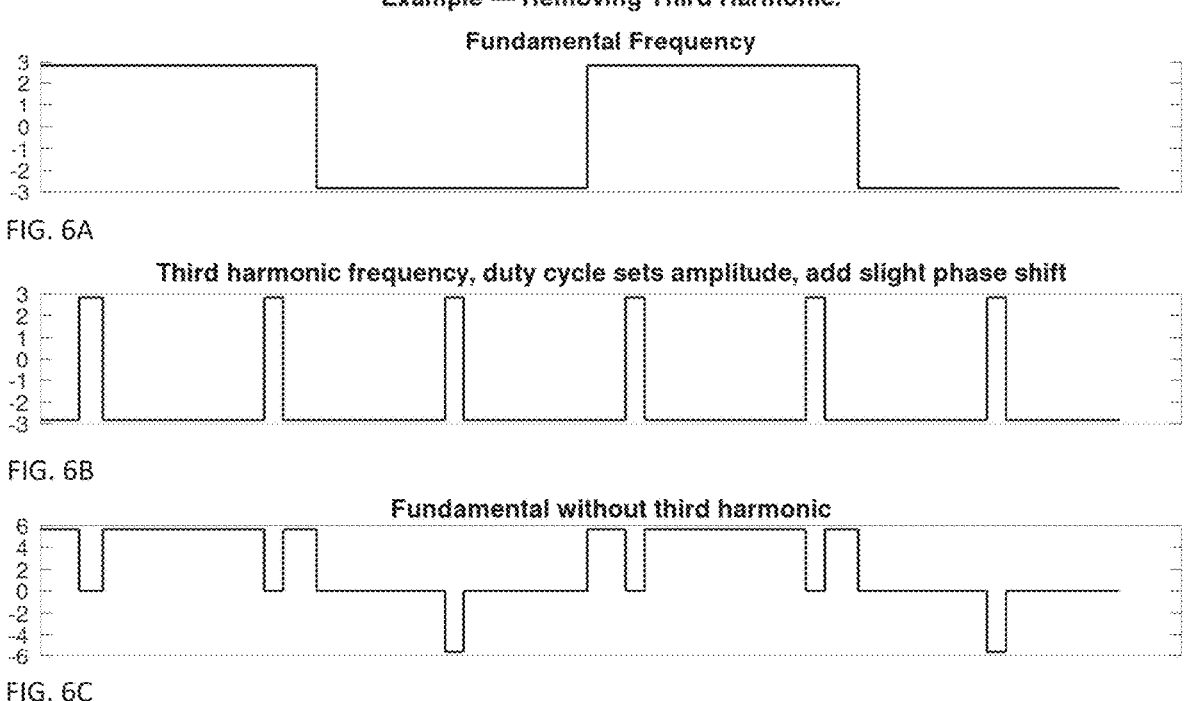
FIGS. 6A, 6B, and 6C illustrate a fundamental frequency, a harmonic frequency, and the fundamental frequency with the harmonic frequency removed, according to embodiments of the present disclosure.

In some embodiments, a method to remove harmonics includes generating, with a control unit, one or more harmonic frequency signals in the time domain. In some embodiments, this is shown in FIG. 2 and FIG. 5. The one or more harmonic frequency signals can, in some embodiments, be modulated in the same manner as a composite, unfiltered signal, and combined or subtracted with the composite, unfiltered signal to create a filtered signal without undesired harmonics. In some embodiments, this is shown in FIGS. 6A-6C. In some embodiments, the filtered signal can include only fundamental, synthesized components used to modulate a signal (i.e., Mark and Space frequencies).

Figure 7A:
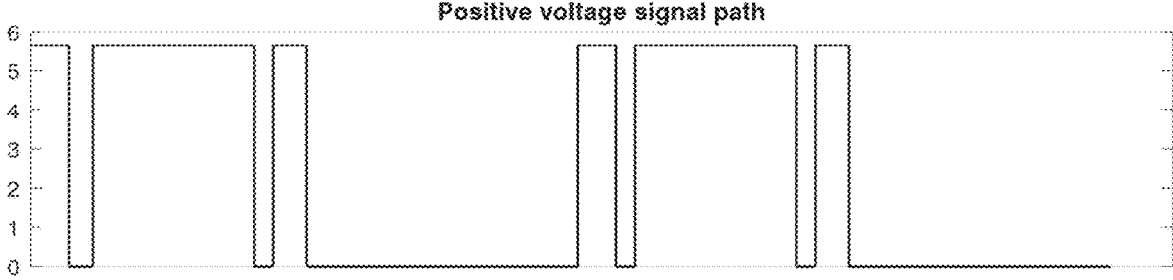
FIGS. 7A and 7B show the example of FIGS. 6A-6C split into a positive signal and a negative signal that can be digitally generated from stored sequences or patterns for design simplicity, according to embodiments of the present disclosure.
Figure 7B:
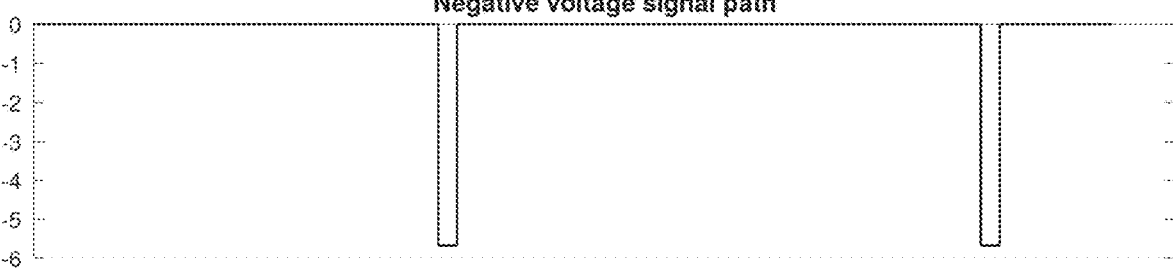

The resultant signal without harmonics, as shown in FIG. 6C, is a signal with three states (+1, 0, −1). To be compatible with a binary system, this signal needs to be split into two separate signals as shown in FIG. 7A-7B. The two signals represent a positive and a negative signal voltage path that represent the three states in FIG. 6C. The positive signal path can be a positive voltage rail running one direction through the electronic load, and the negative signal path can also be a positive voltage rail running the other direction through the electronic load. The negative signal path could also be represented by a negative voltage rail. Alternatively, the two output signals could be represented by two positive voltage rails, which would bias the resultant analog signal. When more harmonics are removed from the original, unfiltered, composite signal, more numerical states will be present, represented by voltage levels in the resultant signal. This facilitates the need to break the resultant signal into more digital output signals. For instance, if the resultant signal had five states, +2, +1, 0, −1, −2, four output signals could be produced, feeding four signal paths with different voltage rails. The voltage rails can be all positive if a voltage bias is desired on the output analog signal, the voltage rails can both be positive but going in different directions through the circuit, or the voltage rails for the four signals could be positive and negative. In some embodiments, one or more filtered signals are generated using counters or bit sequences in flash memory, ROM, etc. that duplicate the result of a filtered signal without undesired harmonics, this implementation reduces computational power needed for the desired result.

In some embodiments, the harmonic frequency signals are synthesized and modulated from a same clock that produced the composite, unfiltered signal. In some embodiments, this is shown in FIG. 6A and FIG. 6B.

In some embodiments, a modulator configured to digitally generate a communication signal whose modulation represents coded information to be transmitted to a local management unit; and a control unit configured to generate a raw modulated signal along with modulated harmonic frequencies that are in-phase, inverted, or out-of-phase with a raw, fundamental signal and produce a modulated output that is free of selected spurious emissions. In some embodiments, the coded information is a message to be transmitted to the local management unit.

In some embodiments, the out-of-phase signals are inverted with the raw signals to produce a signal free of selected spurious emissions.

In some embodiments, the control unit comprises an amplitude controller configured to adjust and/or set the amplitude of the harmonic frequency signal.

In some embodiments, the amplitude controller is configured to adjust the harmonic frequency signal by adjusting/setting voltage supply rails, a voltage divider, an open drain circuit, a collector circuit, or combinations thereof.

In some embodiments, the amplitude controller sets the amplitude of the harmonic frequency signal by setting a duty cycle of the harmonic frequency signal.

In some embodiments, a combiner to combine the out-of-phase harmonic frequency signal with the first signal.

In some embodiments, the transmitter comprising a subtractor to subtract the in-phase harmonic frequency signal from the first signal.

In some embodiments, the modulator is configured to modulate between synthesized frequencies based on a clock signal.

In some embodiments, the control unit generates a plurality of signals, a first of the plurality of signals having a positive voltage and a second of the plurality of signals having a negative voltage.

In some embodiments, the control unit generates a plurality of signals, a first of the plurality of signals using a voltage rail either positive or negative, another plurality of signals using a voltage rail, and an nth plurality of signals using a unique voltage rail.

In some embodiments, the transmitter is configured to be coupled to a photovoltaic panel.

In some embodiments, the harmonic frequencies are synthesized from a clock signal.

In some embodiments, the harmonic frequencies are synthesized by phase locking to a master clock signal.

In some embodiments, the transmitter includes an oscillator configured to generate a clock signal, wherein the modulator is configured generate first signals to be transmitted on a first direct current power line based on the clock signal.

In some embodiments, a transmitter comprises a modulator configured to generate a communication signal whose modulation represents coded information to be transmitted to a local management unit; and a control unit configured to periodically check whether there are one or more additional transmitters nearby, and, in response to determining the one or more transmitters are nearby, the control unit is configured to synchronize the transmitter with one or more of the one or more additional transmitters.

In some embodiments, the transmitter is in wired communication with the one or more additional transmitters.

In some embodiments, the transmitter is in wireless communication with the one or more additional transmitters.

In some embodiments, the transmitters have a synchronization line running between one or more of the transmitters.

In some embodiments, the transmitter is monitoring (detecting) whether there is a signal generated by a different transmitter. Such monitoring can be by monitoring the DC power line, monitoring a communication line, wireless monitoring, or a combination of these methods. In some embodiments, synchronization can be established without communicating (exchanging messages) between the transmitters.

In some embodiments, the control unit is configured to determine whether the one or more of the one or more additional transmitters is a master or a slave transmitter.

In some embodiments, the control unit is programmed by an operator or an additional program or application to act as a master or a slave transmitter.

In some embodiments, the inverted or out-of-phase signals are inverted or 180° out-of-phase with a raw signal to remove selected spurious emissions.

In some embodiments, the control unit comprises an amplitude controller configured to set or adjust the amplitude of the harmonic frequency signal.

In some embodiments, positive voltage rail and negative voltage rail signals are generated by replicating pre-computed, harmonic free, digital patterns stored in ROM, flash memory, etc.

In some embodiments, the transmitter is configured to detect other transmitters.

In some embodiments, the transmitter comprises an oscillator configured to generate a clock signal, wherein the modulator is configured generate first signals to be transmitted on a first direct current power line based on the clock signal.

In some embodiments, a method includes generating a digital communication signal whose modulation represents coded information to be transmitted to a local management unit; generating harmonic frequencies that are different from a raw, modulated signal, so that selected spurious emissions are prevented.

In some embodiments, the transmitter is configured to detect a transmission via carrier sense multiple access (CSMA), and waits for transmission to cease. In some embodiments, a plurality of transmitters are configured to communicate by selecting a numbered time slot based on a timing beacon or timing counter. Synchronization through CSMA is unique in photovoltaic PLC transmission because the signals typically periodic with a specific transmission length. This makes future transmissions of a transmitter easily predictable which augments CSMA by allowing for different transmitters to arrange themselves into a synchronization pattern via CSMA simply by iterating and adjusting their phase relationships with the other transmitters.

Synchronizing the starting phase of the power line communication (PLC) signal works well provided that message frequency or frequencies are within a close tolerance (+/−1 ppm). In some embodiments, if the difference between master/leader and slave/follower oscillators is 20 ppm, the two PLC signals will add together at the beginning of the PLC message, but will cancel each other out (180° out-of-phase) at the end of a 168.96 ms PLC message as is specified by SunSpec or IEC. This can create destructive intra-message cross-talk on systems designed to prevent cross-talk!

Because the PLC heartbeat message is a fixed length, the oscillator frequency drift in parts per million (ppm) between master and slave oscillators can be estimated by measuring the length of the fixed-width sync pulse. If the message is variable in length, a fixed-width synchronization pulse can still be used as a frequency reference. The frequency drift estimation can then be used by the slave/follower PLC-transmitter to change its own frequency to match and compensate for any differences between it and its master/leader transmitter. This fixes issues associated with oscillator aging, temperature changes, etc.

Figure 8:
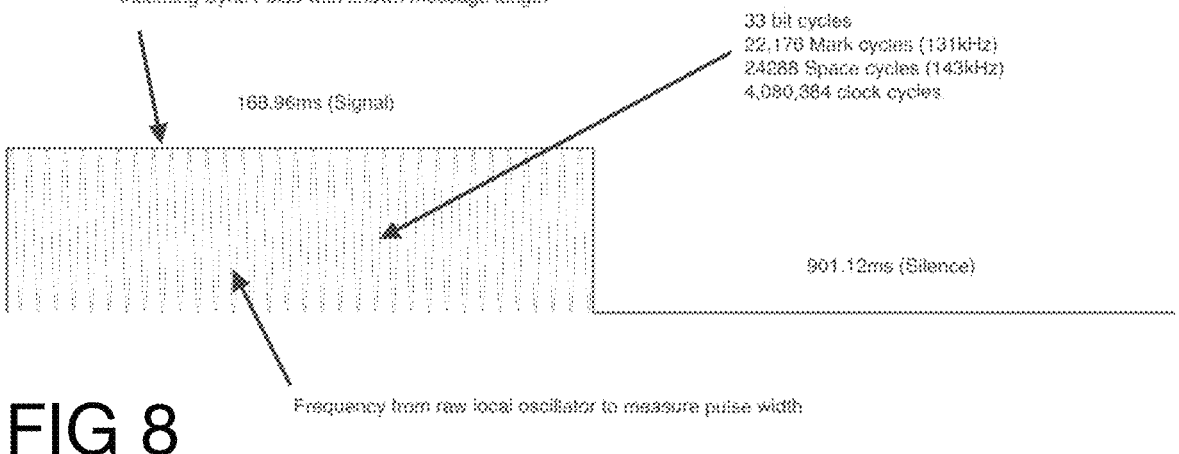
FIG. 8 shows an pulse width from a local oscillator, according to embodiments of the present disclosure.

The slave/follower transmitter's local oscillator (LO) can be used to count the number of clock cycles it takes to measure the fixed-width sync pulse. As an example (FIG. 8), the LO could count 4,080,384 cycles with a 24.15 MHz crystal over a fixed pulse width of 168.96 ms. If more cycles are counted than anticipated, the master/leader LO is operating at a lower frequency. If fewer cycles than expected are counted, the master/leader is operating at a higher LO frequency. A PLL could be used to step-up the frequency of a LO, and this higher frequency could be used to count the fixed-width pulse.

The sync pulse can be of any fixed, pre-determined length with a periodicity that is preferably faster than the LO drift rate due to retrace/aging/temperature, etc. For example, the fixed sync pulse width can be the envelope of the PLC heartbeat signal of 168.96 ms.

The above method uses the raw oscillator frequency to estimate ppm difference in an open-loop fashion. This method works as long as the slave/follower LO is fairly accurate within a tolerance of approximately +/-20 ppm.

In some embodiments, if the slave/follower's LO is off by, for example, –100 ppm, the LO's raw oscillator will not be able to count the fixed pulse-width sync signal accurately enough to make a good frequency estimation of the master/leader's frequency. This is because there are two unknowns to determine (master LO error and slave LO error) with only one equation (fixed pulse—with count equates to ppm difference between LOs).

To add dynamic range to the frequency estimator, a feedback mechanism can be used to accommodate for larger PPM errors in the slave/follower's LO.

To do this, the slave/follower LO can synthesize an Intermediate Frequency (IF) via an NCO to measure the fixed sync-pulse width. In a preferred implementation, the IF could be a ppm adjusted LO frequency, created by stepping up the LO frequency with a PLL and then synthesizing a ppm adjusted frequency. The frequencies used in the transmitter message could also be used, but with less accuracy. The ppm error measurement made by a synthesized IF frequency provides a feedback path in which the ppm error becomes a closed-loop frequency discriminator for an Automatic Frequency Control (AFC) loop.

The AFC loop can be closed with just a gain adjustment, minimal filtering, or no filtering at all because the ppm drift rate is very small (<1 ppm) between leader/follower LOs even with changes in temperature from second to the next second.

In some embodiments, if acceleration and jerks are anticipated, higher order filtering can be used.

A lookup table can be pre-calculated and stored in flash memory (or by other means) that associates a fixed sync pulse time counted by a clock (represented as ppm error) with a control frequency word of a numerically controlled oscillator (NCO).

The frequency error between LOs may then be indexed against the look up table and the associated frequency control word from the look up table can be loaded into the NCO's frequency control word to adjust the slave/follower's synthesized frequency(s) to match the master/leader's oscillator frequencies. This matched, synthesized, ppm adjusted frequency can be used to synthesize frequencies and modulate a PLC message that matches the master/leader's message in both phase and frequency.

Figure 9:
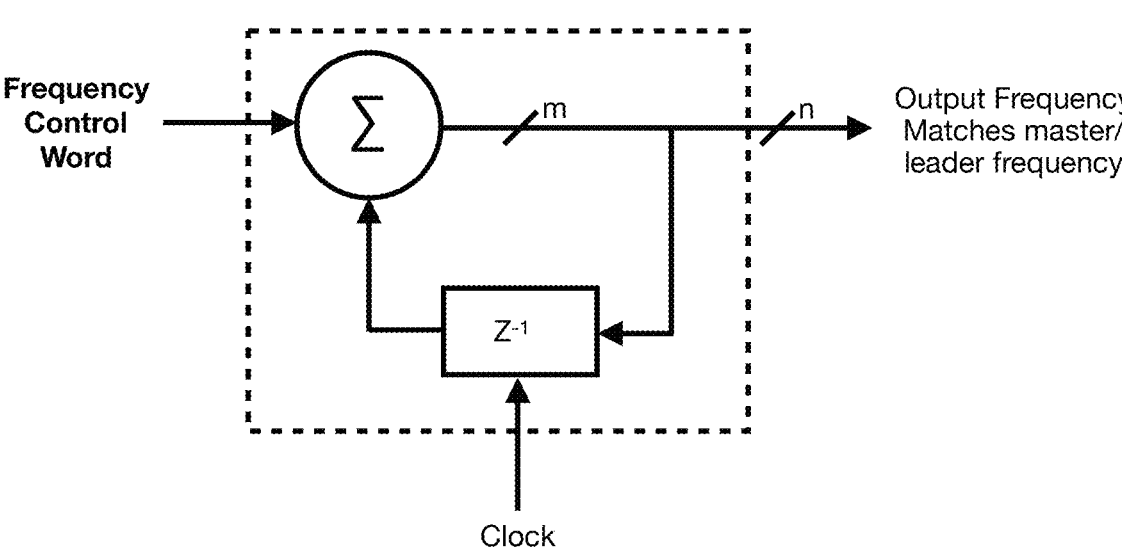
FIG. 9 shows a number of bits in a phase accumulator and frequency, according to embodiments of the present disclosure.

In FIG. 9, a number of bits (m) in the phase accumulator and frequency control word can determine the accuracy of the synthesized frequency regardless of the clock frequency. In some embodiments, the number of bits used in the output (n) can control the amount of phase jitter seen on the output clock signal. A single bit on the output (n=1) can be used as a digital clock to synthesize PLC frequencies and modulate the PLC message. In some embodiments, more phase bits (n) can be used in a lookup table to produce an analog sine wave if needed. In addition, multiple clock frequencies can be synthesized simultaneously. In some embodiments, a clock could be synthesized to generate a fundamental frequencies along with another synthesized clock that generates harmonic frequencies to be removed from a composite signal.

What is claimed is:

1. A transmitter, comprising:
a modulator configured to digitally generate a communication signal whose modulation represents coded information to be transmitted to a local management unit; and
a control unit configured to:
generate harmonic frequencies that are in-phase, inverted, or out-of-phase from a raw signal using fundamental frequencies for modulation;
create a filtered signal free of harmonics, including digitally synthesizing harmonic waveforms corresponding to undesired harmonics of the raw signal and removing the synthesized harmonic waveforms from the raw signal;
generate a plurality of signals using a first signal path and a second signal path,
wherein the first signal path includes a positive voltage or a negative voltage and the second signal path includes a positive voltage or a negative voltage;
wherein the transmitter is configured to be coupled to a photovoltaic panel.

2. The transmitter of claim 1, wherein the out-of-phase signals are inverted or 180° out-of-phase with the raw signal.

3. The transmitter of claim 1, wherein the control unit comprises an amplitude controller configured to set the amplitude of the harmonic frequencies.

4. The transmitter of claim 3, wherein the amplitude controller is configured to set the harmonic frequencies by adjusting voltage supply rails, a voltage divider, an open drain circuit, a collector circuit, or combinations thereof.

5. The transmitter of claim 3, wherein the amplitude controller sets the amplitude of the harmonic frequencies by setting a duty cycle of the harmonic frequencies.

6. The transmitter of claim 1, comprising a combiner to combine the out-of-phase harmonic frequencies with the raw signal.

7. The transmitter of claim 1, comprising a subtractor to subtract the in-phase harmonic frequencies from the raw signal.

8. The transmitter of claim 1, wherein the harmonic frequencies are at least one of synthesized or modulated from a clock signal.

9. The transmitter of claim 1, wherein the harmonic frequencies are at least one of synthesized or modulated by phase locking to a clock signal.

10. The transmitter of claim 1, comprising an oscillator configured to generate a clock signal, wherein the modulator is configured to generate first signals to be transmitted on a first direct current power line based on the clock signal.

\* \* \* \* \*